United States Patent
Dubin

(10) Patent No.: US 6,921,684 B2
(45) Date of Patent: Jul. 26, 2005

(54) METHOD OF SORTING CARBON NANOTUBES INCLUDING PROTECTING METALLIC NANOTUBES AND REMOVING THE SEMICONDUCTING NANOTUBES

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/688,854

(22) Filed: Oct. 17, 2003

(65) Prior Publication Data

US 2005/0106846 A1 May 19, 2005

(51) Int. Cl.[7] .................. H01L 21/335; H01L 21/8232; H01L 21/00; H01L 21/84; H01L 21/31
(52) U.S. Cl. ...................... 438/142; 438/159; 438/778; 438/780; 977/DIG. 1
(58) Field of Search ................................ 438/142, 159, 438/778, 780; 257/213; 977/DIG. 1

(56) References Cited

U.S. PATENT DOCUMENTS 6,325,909 B1   12/2001   Li et al.
2002/0173083 A1 * 11/2002   Avouris et al. ............. 438/129

OTHER PUBLICATIONS

"Self-aligned Electrodes for Suspended Carbon Nanotube Structures", Robinson, L.A.W.; Micoelectronic Engineering 67–68 (2003), pp. 615–622.*

L. Grigorian, et al.; Transport properties of alkali–metal– doped single–wall carbon nanotubes; Aug. 15, 1998; The American Physical Society, Third Series, vol. 58, No. 8; pps. R4195–R4198.
R. Martel, et al.; Single– and multi–wall carbon nanotube field–effect transistors; Oct. 26, 1998; Applied Physics Letters, vol. 73, No. 17, pps. 2447–2449.
Jing Li, et al.; Growing Y–junction carbon nanotubes; Nov. 18, 1999; Nature, vol. 402, pps. 253–254.
Jing Kong, et al.; Alkaline metal–doped n–type semiconducting nanotubes as quantum dots; Dec. 11, 2000; Applied Physics Letters, vol. 77, No. 24, pps. 3977–3979.
S. Niyogi, et al.; Chromatographic Purification of Soluble Single–Walled Carbon Nanotubes; Jan. 9, 2001; J. Am. Chem. Soc. 2001, 123, pps. 733–734.
Phaedon Avouris, et al.; Carbon Nanotube Electronics; May 2002; philadelphia meeting abstracts, vol. 2002–1.
Debjit Chattopadhyay, et al.; A Route for Bulk Separation of Semiconducting from Metallic Single–Wall Carbon Nanotubes; Feb. 22, 2003; J. Am. Chem. Soc. 2003, 125, pps. 3370–3375.

* cited by examiner

*Primary Examiner*—Olik Chaudhuri
*Assistant Examiner*—William M. Brewster
(74) *Attorney, Agent, or Firm*—Fish & Richardson P.C.

(57) ABSTRACT

A method for sorting nanotubes and forming devices based upon selective nanotube types is provided. The disclosure provides methods of sorting semiconducting nanotubes useful in the formation of field effect transistors, diodes, and resistors. The disclosure also provides methods of sorting metallic nanotubes useful in the formation of interconnect devices.

11 Claims, 1 Drawing Sheet

METHOD OF SORTING CARBON NANOTUBES INCLUDING PROTECTING METALLIC NANOTUBES AND REMOVING THE SEMICONDUCTING NANOTUBES

FIELD OF THE INVENTION

The invention relates to nanotubes and more particularly to a method and system for sorting nanotubes, e.g., made from carbon.

BACKGROUND

A single-walled carbon nanotube (SW-CNT) is a nanometer scale tube formed by a cylindrical shell of single atomic layer of carbon atoms. Nanotubes have diameter of a few nm and lengths up to 100 $\mu$m so that they form extremely thin wires. The atomic structure of SW-CNT can be formed by wrapping a strip of single atomic layer of graphite sheet along a certain direction. This direction determines the diameter and chirality of the nanotubes.

Experimental and theoretical studies have demonstrated interesting properties from nano-meter sized CNTs have novel electronic properties, which can be metallic or semiconducting, depending on their radius or chiralities.

During manufacture, SW-CNT's include a mixture of metallic and semiconducting nanotubes, thus being difficult to handle. Thus, the nanotubes have been randomly dispersed during the preparations of transistors, diodes, and the like. Application of nanotubes in electronics requires selected types of nanotubes, for example, use of SW-CNT's as transistor channels requires semiconducting SW-CNT's while use of SW-CNT's as conductors for on-chip interconnects requires metallic SW-CNT's. A controlled method of reliably placing and sorting nanotubes is desired.

DETAILED DESCRIPTION

Figure 1:
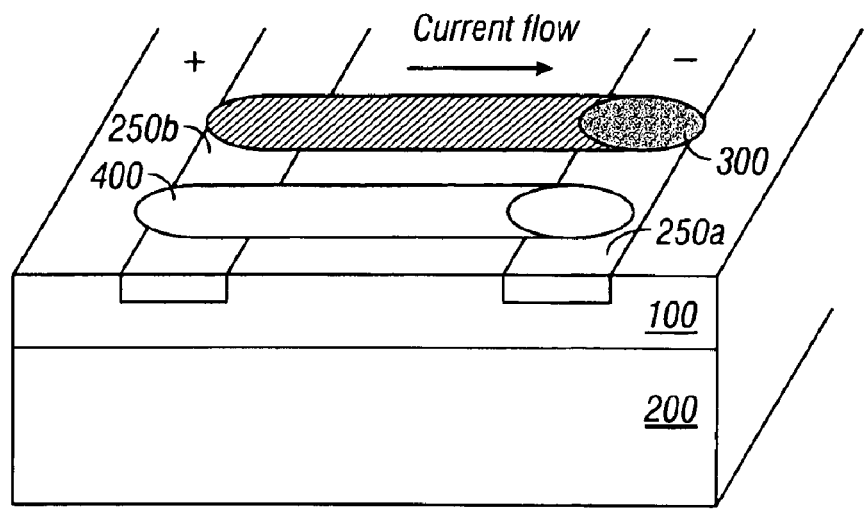
FIG. 1 illustrates sorting semiconducting nanotubes and removing metallic nanotubes.

The disclosure describes a method for selection or sorting single-walled nanotubes including carbon, boron-nitride and metal dichalcogenid based nanotubes. A single walled carbon nanotube (SW-CNT) can be formed of different materials. Typical material-types generally include metallic or semiconducting material. The disclosure provides methods that selectively remove one material-type nanotube while retaining other types of nanotubes. The process of selecting one nanotube material-type over another find use in the production of transistors, resistors, and diodes.

The physio-chemical properties of the material are used to selectively remove metallic nanotubes and thereby retain semiconducting nanotubes. For example, current may be used to burn/dissolve metallic SW-CNTs while semiconducting nanotubes are protected by applying gate voltage to semiconductor SW-CNT to increase their resistivity. In another example, metallic SW-CNTs are prevented from dissolving by cathodic protection, while the semiconducting nanotubes are dissolved by a strong acid or a strong acid and photon energy. Photon energy generates electron-hole pairs in semiconducting SW-CNT to selectively dissolve such semiconducting SW-CNTs in strong acids without the dissolution of metallic SW-CNTs.

The methods as described exploit the ability of selectively dissolving nanotubes carrying current while "protected" nanotubes (i.e., those incapable of carrying current) remain intact. Various methods for "protecting" one class of materials while allowing current to course through another class of materials are known in the art.

Semiconducting SW-CNTs can be protected by depleting a semiconducting material of carriers. This is achieved where a semiconducting SW-CNT is in contact with a source electrode and a drain electrode and a voltage is applied to a gate electrode such that carriers are depleted from the semiconducting SW-CNT. Thus, the semiconducting SW-CNT is "protected" because it is unable to carry a current, while metallic SW-CNTs can carry current. A current is then applied to the nanotubes such that the metallic (i.e., non-protected) nanotubes are dissolved, thereby selecting/sorting semiconductive nanotubes from metallic nanotubes.

This can be performed on a dielectric layer ($SiO_2$) of a silicon substrate (e.g., a silicon wafer). A pattern of electrodes/conductors is generated on the substrate and corresponds to source/drain regions. The formation of contacts to the source and drain electrodes can be done by lithography and etch techniques to form etched areas, followed by filling the etched areas with metals. The material composition of the electrodes/conductors includes, for example, poly-silicon, salicides (e.g., Co, Ni, and the like), refractory metals (e.g., Ni, Co, Mo, Ta, W, Nb, Zr, Hf, Ir, and La), nobel metals (e.g., Ru, Rh, Pt, and Au), and any combination thereof. A solution comprising semiconducting and metallic SW-CNTs is dispensed upon the substrate and contact with the SW-CNT and the electrode/conductor patterns is formed by selective metal deposition techniques such as e-beam or focused ion beam (FIB) assisted metal deposition (Pt, Au, Ag., and the like). A voltage is then applied to the substrate to modulate the resistivity of the semiconducting SW-CNTs (i.e., carrier depletion). A current is applied and will selectively traverse the metallic SW-CNTs because the metallic SW-CNTs will have a lower resistivity in comparison to the semiconducting SW-CNTs. As the current passes through the metallic SW-CNTs the metal becomes hot and burns/dissolves.

Referring now to FIG. 1. FIG. 1 shows a $SiO_2$ layer 100 on substrate 200. Electrode/conductor pattern 250a and 250b are disposed on layer 100. Electrode/conductor pattern 250a and 250b comprise a source and drain electrode. For example, 250a can comprise the drain electrode while 250b comprises the source electrode. A plurality of SW-CNTs is disposed on substrate 200 comprising $SiO_2$ layer 100. The plurality of SW-CNTs will comprise, for example, semiconducting SW-CNTs and metallic SW-CNTs. Depicted in FIG. 1 are SW-CNTs 300 and 400. For example, metallic SW-CNT 300 and semiconducting SW-CNT 400 are disposed upon substrate 200 comprising layer 100. During operation gate voltage is applied such that the source and drain electrode/conductor patterns 250a and 250b remove carriers from a semiconducting SW-CNT 400. Metallic SW-CNT 300 is still capable of carrying current. Current is applied and the current selectively traverses the metallic SW-CNT 300 due to a lower resistivity compared to the semiconducting SW-CNT 400. The metallic SW-CNT 300 becomes increasingly hot until it burns/dissolves away, leaving only semiconducting SW-CNT 400.

The foregoing methods are useful for the preparation of field effect transistor (FETs), diodes and resistors. In some instances, it may be desirable to prepare a conducting pattern for interconnects based upon metallic nanotubes.

Accordingly, the disclosure also includes a method whereby metallic nanotubes are selected/sorted from semiconducting nanotubes. Metallic SW-CNTs can be protected by cathodic voltage protection. Cathodic voltage protection is the result of an overall negative charge on a metallic SW-CNT. This is achieved where a metallic SW-CNT is in contact with a cathode. Thus, the metallic SW-CNT is "protected" because the nanotubes will not be attached/dissolved by negatively charged acid anions (e.g., $NO^{3-}$, $SO^{4-}$, and the like) since the anions are repulsed from the overall negative charge of the metallic SW-CNT, while semiconducting SW-CNTs are subjected to strong acids that will eat away at the semiconducting SW-CNT. Accordingly, the semiconducting (i.e., non-protected) nanotubes are dissolved thereby selecting/sorting metallic nanotubes from semiconducting nanotubes.

To form interconnects of conducting patterns, a mixture of semiconducting and metallic SW-CNTs are dispensed onto a substrate comprising a pattern of electrodes/conductors. Selective metal deposition techniques are then used to form contacts to the SW-CNTs using techniques such as e-beam or FIB assisted metal deposition of metals such as Pt, Au, and the like. A negative potential is then applied to the metallic SW-CNTs through the double electrical layer and the anode or semiconductor substrate through the dielectric layer. This negative voltage also serves to modulate conductivity of semiconducting SW-CNTs by depleting the semiconducting SW-CNTs. A strong acid such as, for example, $HNO_3$, $H_2SO_4$, or the like, is then added to the substrate comprising the SW-CNTs. The strong acid will selectively dissolve the semiconducting SW-CNT while the metallic SW-CNTs are protected by negative charge (cathodic protection). The semiconducting SW-CNT may also be dissolved by a combination of acid and induction of a photopotential in the semiconducting material. A photopotential generated by photon energy contacting the depletion region of the semiconducting material results in the formation of electron-hole pairs.

A photon energy source as used herein can be any type of light source that emits photon energy, e.g., a focused beam of photon energy (e.g., light) or which may be modified using various filters, mirrors, lens, and/or apertures to direct a focused beam of photon energy. Filters make it possible to adjust the luminous power to values of less than, equal to, or greater than a threshold value for generation of a photopotential. The photon energy contacting the semiconducting material may be modified to obtain a desired geometric shape such as a focused point, a focused line of a millimeter or less in length, a curved "parenthetical shaped" geometry, and the like. Accordingly, photon energy sources include laser diodes or light emitting diodes that emit light in the visible or very near-infrared wavelength ranges.

Figure 2:
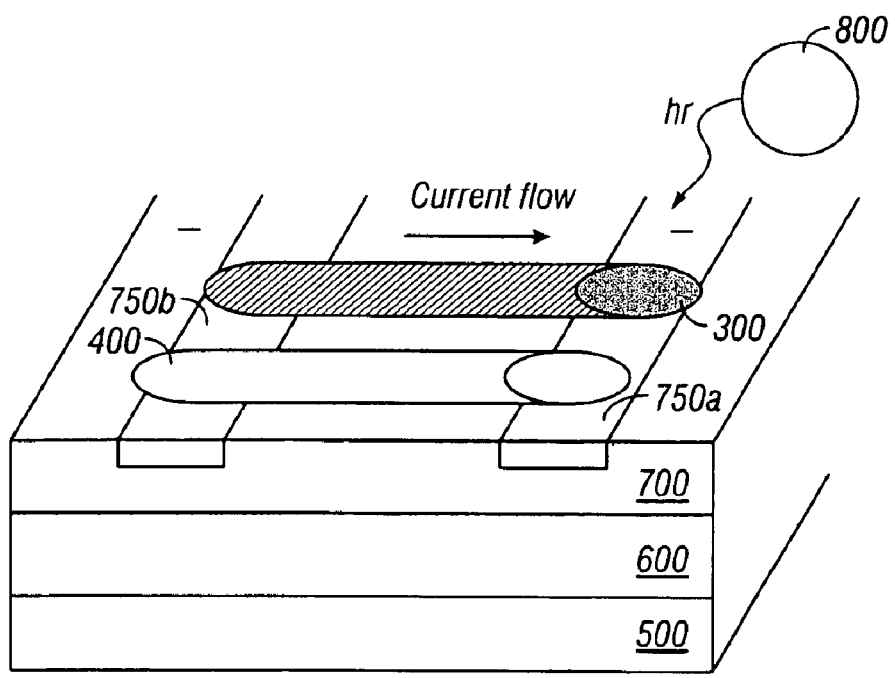
FIG. 2 shows a method and device useful for sorting metallic nanotubes and removing semiconducting nanotubes.

FIG. 2 shows a substrate 500 comprised of, for example, a silicon wafer, a device layer 600, and an inter-layer dielectric (ILD) layer 700 formed of, for example, low-k carbon doped silicon dioxide. The insulating layer 700 is of a desired thickness (e.g., typically about 3 microns to 10 microns). Typically a low-k (low dielectric constant material) with a dielectric constant of less than about 3 is used in order to reduce signal delay times. Conventional silicon dioxide may be used as the insulating layer 700. Other exemplary materials that may be used in the ILD layer, include low-k organic materials applied by a spin coating process. Electrode/conductor pattern 750a and 750b are located on insulating layer 700. A plurality of SW-CNTs is disposed on insulating layer 700. The plurality of SW-CNTs will comprise, for example, semiconducting SW-CNTs and metallic SW-CNTs.

FIG. 2 shows SW-CNTs 300 and 400. For example, metallic SW-CNT 300 and semiconducting SW-CNT 400 are disposed upon insulating layer 700. During operation gate voltage is applied such that electrode/conductor patterns 750a and 750b comprise a negative potential. Metallic SW-CNT 300 become negatively charged and undergo cathodic voltage protection. An acid is then contacted with the insulating layer 700 comprising the SW-CNTs. The acid selectively dissolves the semiconducting SW-CNTs 400 because the negatively charged, cathodicly protected metallic SW-CNTs are protected from the strong acid. An optional photon energy source 800 is depicted in FIG. 2. The optional photon energy source may be used to generate a thus further assist in dissolving the CNT 400.

What is claimed is:

1. A method comprising:

providing a substrate;

providing a plurality of semiconducting and metallic nanotubes in contact with the substrate;

selectively protecting the metallic nanotubes and leaving the semiconducting nanotubes as non-protected semiconductive nanotubes; and dissolving the non-protected nanotubes, to leave only protected metallic nanotubes;

wherein the protecting of the metallic nanotubes is by cathodic protection in a strong acid solution.

2. The method of claim 1, wherein the semiconducting nanotubes are selectively removed by the strong acid solution.

3. The method of claim 2, further comprising contacting the semiconducting nanotubes with photon energy to generate electron-hole pairs.

4. A method, comprising:

providing a substrate;

providing a plurality of semiconducting and metallic nanotubes in contact with the substrate;

selectively protecting the metallic nanotubes from acid degradation by cathodic protection; and contacting the substrate comprising the nanotubes with an acid such that the non-protected semiconductive nanotubes are selectively removed.

5. The method of claim 4, wherein the substrate comprises an inter layer dielectric (ILD).

6. The method of claim 4, wherein the semiconducting nanotubes are selectively removed by the strong acid solution.

7. The method of claim 4, further comprising contacting the semiconducting nanotubes with photon energy to generate electron-hole pairs.

8. A method of forming a device comprising interconnects providing a substrate;

providing a plurality of semiconducting and metallic nanotubes in contact with the substrate;

selectively protecting the metallic nanotubes from acid degradation by cathodic protection; and contacting the substrate comprising the nanotubes with an acid such that the non-protected semiconductive nanotubes are selectively removed.

9. The method of claim 8, wherein the substrate comprises an inter layer dielectric (ILD).

10. The method of claim 8, wherein the semiconducting nanotubes are selectively removed by the strong acid solution.

11. The method of claim 8, further comprising contacting the semiconducting nanotubes with photon energy to generate electron-hole pairs.

* * * * *